(12) United States Patent
Hong

(10) Patent No.: US 7,846,797 B2
(45) Date of Patent: Dec. 7, 2010

(54) TUNNEL INSULATING LAYER OF FLASH MEMORY DEVICE AND METHOD OF FORMING THE SAME

(75) Inventor: Kwon Hong, Seongnam-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 91 days.

(21) Appl. No.: 12/345,617

(22) Filed: Dec. 29, 2008

(65) Prior Publication Data
US 2009/0166711 A1 Jul. 2, 2009

(30) Foreign Application Priority Data
Jan. 2, 2008 (KR) .................. 10-2008-0000076

(51) Int. Cl.
*H01L 21/336* (2006.01)
(52) U.S. Cl. .................. 438/264; 438/263; 438/594
(58) Field of Classification Search .................. 438/264, 438/263, 594; 257/321, 411
See application file for complete search history.

(56) References Cited

U.S. PATENT DOCUMENTS

2006/0166440 A1* 7/2006 Kaneoka et al. ............. 438/257
2007/0018231 A1* 1/2007 Mitani et al. ................ 257/315

FOREIGN PATENT DOCUMENTS

| KR | 10-2004-0019986 | 3/2004 |
| KR | 10-2005-0039339 | 4/2005 |

* cited by examiner

Primary Examiner—Mark Prenty
(74) Attorney, Agent, or Firm—Marshall, Gerstein & Borun LLP

(57) ABSTRACT

The present invention discloses a tunnel insulating layer in a flash memory device and a method of forming the same, the method according to the present invention comprises the steps of forming a first oxide layer on a semiconductor substrate through a first oxidation process; forming a nitride layer on an interface between the semiconductor substrate and the first oxide layer through a first nitridation process; forming a second nitride layer on the first oxide layer through a second nitridation process; forming a second oxide layer on the second nitride layer through a second oxidation process; and forming a third nitride layer on the second oxide layer through a third nitridation process.

8 Claims, 1 Drawing Sheet

TUNNEL INSULATING LAYER OF FLASH MEMORY DEVICE AND METHOD OF FORMING THE SAME

CROSS-REFERENCE TO RELATED APPLICATION

This application claims priority from Korean Patent Application No. 10-2008-0000076, filed on Jan. 2, 2008, the contents of which are incorporated herein by reference in its entirety.

BACKGROUND OF THE INVENTION

The present invention relates to a tunnel insulating layer in a flash memory device and a method of forming the same, more particularly, relates to a tunnel insulating layer in a flash memory device in which a bulk defect can be reduced, and a method of forming the same.

A flash memory device is a non-volatile memory device being capable of performing an electrical programming and erasing operations and capable of storing the data in a state where power is turned off.

The flash memory device utilizes a memory cell having the structure in which a tunnel insulating layer, a floating gate, a dielectric layer and a control gate are stacked to perform the programming, erasing and writing operations for the data. The programming and erasing operations of the flash memory device are performed by the F-N (Fowler-Nordheim) tunneling phenomenon generated through the tunnel insulating layer. Accordingly, a quality of the tunnel insulating layer is the major factor influencing an electrical characteristic of the flash memory device.

SUMMARY OF THE INVENTION

An object of the present invention is to provide a tunnel insulating layer in a flash memory device and a method of forming the same. In the present invention, nitride layers are formed on the interface between a tunnel insulating layer and a semiconductor substrate, in an inside of the tunnel insulating layer and on a surface of the tunnel insulating layer, and so defects or hydrogen existed in the tunnel insulating layer are eliminated to reduce a trap site in the tunnel insulating layer. As a result, an electrical characteristic of the flash memory device is enhanced.

In the tunnel insulating layer of the flash memory device according to the embodiment of the present invention, a plurality of nitride layers and a plurality of oxide layers are sequentially stacked and the uppermost layer and the lowermost layer are the nitride layer. The nitride layer has nitrogen atom content of 5 to 30% with respect to the total atom amount therein. And, the oxide layer has a thickness of 20 to 50 Å.

The method of forming the tunnel insulating layer of the flash memory device according to the embodiment of the present invention comprises the steps of; forming a first oxide layer on a semiconductor substrate through a first oxidation process; forming a nitride layer on an interface between the semiconductor substrate and the first oxide layer through a first nitridation process; forming a second nitride layer on the first oxide layer through a second nitridation process; forming a second oxide layer on the second nitride layer through a second oxidation process; and forming a third nitride layer on the second oxide layer through a third nitridation process.

The first and second oxidation processes are performed by using a dry or wet or radical oxidation method. Preferably, the first oxide layer and the second oxide layer have a thickness of 20 to 50 Å. Also, the first and second oxide layers are formed within the temperature range of 900 to 950° C.

Preferably, the first, second and third nitride layers are formed such that the nitrogen atom content with respect to the total atom amount in each nitride layer 110 is 5 to 30%. Also, the first nitride layer is performed through a nitridation process utilizing nitrogen monoxide (NO) gas or dinitrogen monoxide ($N_2O$) gas. The second nitride layer and the third nitride layer are formed through a plasma nitridation process. And, the nitridation processes are performed within the temperature range of 500 to 700° C.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings. Hereinafter, the preferred embodiments of the present invention will be explained in more detail with reference to the accompanying drawings. However, it should be understood that the embodiment of the present invention can be variously modified, a scope of the present invention is not limited to the embodiment described herein, and the embodiment is provided for explaining more completely the present invention to those skilled in the art.

FIG. 1 to FIG. 5 are sectional views of a device illustrating a method of forming a gate insulating layer of a flash memory device according to the embodiment of the present invention.

Figure 1:
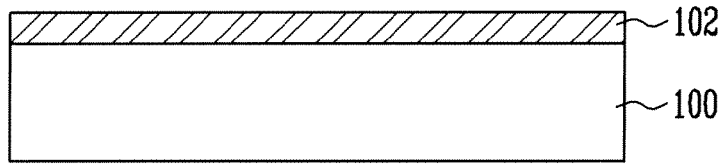
FIG. 1 to FIG. 5 are sectional views of a device illustrating a method of forming a gate insulating layer of a flash memory device according to the embodiment of the present invention.

Referring to FIG. 1, a first tunnel insulating layer 102 is formed on a semiconductor substrate 100. It is preferable to form the first tunnel insulating layer 102 through a dry, wet or radical oxidation process. It is preferable that the first tunnel insulating layer 102 has a thickness of 20 to 50 Å. It is preferable that the first tunnel insulating layer 102 is formed within the temperature range of 900 to 950° C.

Figure 2:
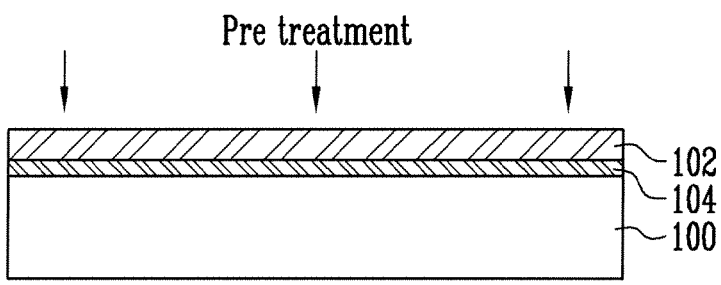

Referring to FIG. 2, a nitridation process utilizing nitrogen monoxide (NO) gas or dinitrogen monoxide ($N_2O$) gas is performed to form a first nitride layer 104 on an interface between the first tunnel insulating layer 102 and the semiconductor substrate 100. The first nitride layer 104 is formed under atmosphere of nitrogen monoxide (NO) gas or dinitrogen monoxide ($N_2O$) gas, and it is preferable that a partial pressure of nitrogen monoxide (NO) gas or dinitrogen monoxide ($N_2O$) gas is 5% to 50%. Preferably, the first nitride layer 104 is formed by piling-up nitrogen between the first tunnel insulating layer 102 and the semiconductor substrate 100. It is preferable that the nitrogen atom content with respect to the total atom amount in the first nitride layer 104 is 5 to 30%.

Figure 3:
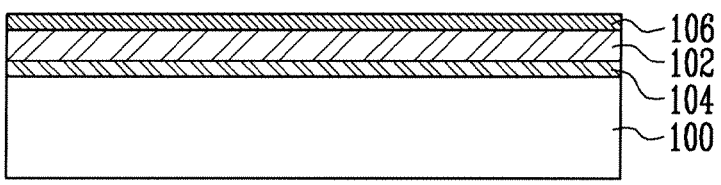

Referring to FIG. 3, a plasma nitridation process is carried out to form a second nitride layer 106 on a surface of the first tunnel insulating layer 102. It is preferable that the second nitride layer 106 is formed such that the nitrogen atom content with respect to the total atom amount in the second nitride layer 106 is 5 to 30%. Preferably, the plasma nitridation process is carried out within the temperature range of 500 to 700° C.

Figure 4:
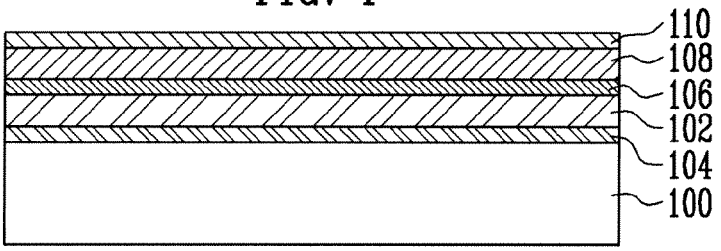

Referring to FIG. 4, a second tunnel insulating layer 108 is formed on the entire structure including the second nitride layer 106. It is preferable to form the second tunnel insulating layer 108 through a dry, wet or radical oxidation process. It is preferable that the second tunnel insulating layer 108 has a thickness of 20 to 50 Å. It is preferable that the second tunnel insulating layer 108 is formed within the temperature range of 900 to 950° C.

Then, a plasma nitridation process is performed to form a third nitride layer 110 on the second tunnel insulating layer 108. It is preferable that the third nitride layer 110 is formed such that the nitrogen atom content with respect to the total atom amount in the third nitride layer 110 is 5 to 30%. Preferably, the plasma nitridation process is carried out within the temperature range of 500 to 700° C.

As a result, it is possible to obtain the tunnel insulating layer having the structure in which the first nitride layer 104, the first tunnel insulating layer 102, the second nitride layer 106, the second tunnel insulating layer 108 and the third nitride layer 110 are sequentially stacked on the semiconductor substrate.

In this structure, the nitride layers are formed on the interface between the tunnel insulating layer and the semiconductor substrate, in an inside of the tunnel insulating layer and on a surface of the tunnel insulating layer, and so defects or hydrogen existed in the tunnel insulating layer are eliminated to reduce a trap site in the tunnel insulating layer. As a result, an electrical characteristic of the flash memory device is enhanced.

Figure 5:
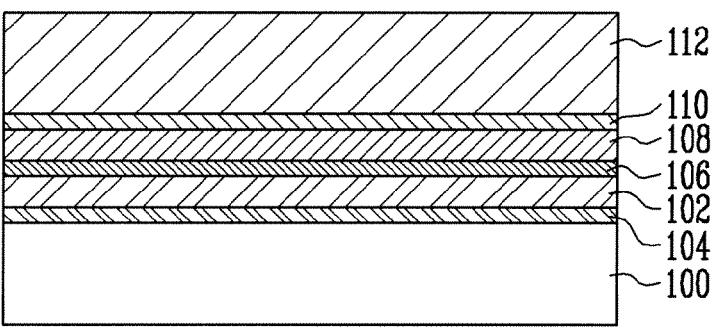

Referring to FIG. 5, a conductive layer 112 for a floating gate is formed on the entire structure including the third nitride layer 106. It is preferable that a poly silicon layer is formed as the conductive layer 112 for a floating gate.

As one example, in one embodiment of the present invention, the structure in which the first nitride layer 104, the first tunnel insulating layer 102, the second nitride layer 106, the second tunnel insulating layer 108 and the third nitride layer 110 are stacked is illustrated. However, a tunnel insulating layer and a nitride layer may be formed additionally on the third nitride layer 110.

According to one embodiment of the present invention, the first nitride layer 104 is formed on the interface between the first tunnel insulating layer 102 and a semiconductor substrate 100, the second nitride layer 106 is formed between the first tunnel insulating layer 102 and the second tunnel insulating layer 108 and the third nitride layer 110 is formed on the second tunnel insulating layer 108, and so defects or hydrogen existed in the tunnel insulating layers 102 and 108 are eliminated to reduce a trap site in the tunnel insulating layers 102 and 108. As a result, an electrical characteristic of the flash memory device is enhanced Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of forming a tunnel insulating layer of a flash memory device, comprising the steps of;
   forming a first oxide layer on a semiconductor substrate through a first oxidation process;
   forming a first nitride layer on an interface between the semiconductor substrate and the first oxide layer through a first nitridation process;
   forming a second nitride layer on the first oxide layer through a second nitridation process;
   forming a second oxide layer on the second nitride layer through a second oxidation process; and
   forming a third nitride layer on the second oxide layer through a third nitridation process.

2. The method of forming the tunnel insulating layer of the flash memory device of claim 1, wherein the first and second oxidation processes are performed by using a dry or wet or radical oxidation method.

3. The method of forming the tunnel insulating layer of the flash memory device of claim 1, wherein the first oxide layer and the second oxide layer have a thickness of 20 Å to 50 Å.

4. The method of forming the tunnel insulating layer of the flash memory device of claim 1, wherein the first and second oxide layers are formed within the temperature range of 900° C. to 950° C.

5. The method of forming the tunnel insulating layer of the flash memory device of claim 1, wherein the first, second and third nitride layers are formed such that the nitrogen atom content with respect to the total atom amount in each nitride layer is 5% to 30%.

6. The method of forming the tunnel insulating layer of the flash memory device of claim 1, wherein the first nitride layer is performed through a nitridation process utilizing nitrogen monoxide (NO) gas or dinitrogen monoxide ($N_2O$) gas.

7. The method of forming the tunnel insulating layer of the flash memory device of claim 1, wherein the second nitride layer and the third nitride layer are formed through a plasma nitridation process.

8. The method of forming the tunnel insulating layer of the flash memory device of claim 1, wherein the nitridation processes are performed within the temperature range of 500° C. to 700° C.

* * * * *